United States Patent [19]

Nicholson et al.

[11] Patent Number: 5,081,444

[45] Date of Patent: Jan. 14, 1992

[54] AUTOMOTIVE VEHICLE TEST EQUIPMENT WITH ANTI-TAMPER DEVICE

[75] Inventors: William D. Nicholson, Waukesha; Thomas M. Fudali, Delafield; Robert T. Braun, Milwaukee; John C. Pendell, West Allis; Michael J. Brown, Milwaukee, all of Wis.

[73] Assignee: Bear Automotive Service Equipment Company, New Berlin, Wis.

[21] Appl. No.: 652,115

[22] Filed: Feb. 7, 1991

[51] Int. Cl.[5] ............................ G08B 13/08; H02J 7/00
[52] U.S. Cl. ........................................ 340/545; 307/64; 340/528; 361/170; 364/551.01
[58] Field of Search .................... 340/545-549, 340/679, 528, 543; 200/61.62-61.84; 361/170.2; 307/64; 364/551.01

[56] References Cited

U.S. PATENT DOCUMENTS

| 4,596,203 | 6/1986 | Lorek | 116/215 |
| 4,873,654 | 10/1989 | Alexander et al. | 364/551.01 |
| 4,999,794 | 3/1991 | Yakushiji | 364/707 |

OTHER PUBLICATIONS

Bar 90 Analyzer Specification, State of California, Jun. 20, 1989, pp. 1-168, Table of Contents, Appendixes A-F.

Primary Examiner—Glen R. Swann, III
Assistant Examiner—Thomas J. Mullen, Jr.
Attorney, Agent, or Firm—Kinney & Lange

[57] ABSTRACT

An anti-tamper device in an automotive vehicle test system monitors an access panel to the automotive vehicle test system. An alarm is actuated if the access panel is opened. The automotive vehicle test system tests automotive vehicles and prints certificates which verify test results. The access panel is unlocked following the completion of an automotive vehicle test so that an operator can gain access to a printer to retrieve a printed certificate. The test system monitors the condition of the access panel even if power is removed from the automotive vehicle test system. A large capacitor provides power to monitoring circuitry. A data latch, powered by the capacitor, latches the condition of the access panel. The alarm is sounded when power is returned to the automotive vehicle test system and the condition of the latch indicates that an access panel has been opened.

20 Claims, 3 Drawing Sheets

AUTOMOTIVE VEHICLE TEST EQUIPMENT WITH ANTI-TAMPER DEVICE

BACKGROUND OF THE INVENTION

The present invention relates to automotive vehicle test equipment. In particular, the invention relates to automotive vehicle test equipment which includes an anti-tamper device.

Automotive vehicle test equipment is used to measure various parameters which relate to automotive vehicles. For example, automotive vehicle test equipment can test parameters such as vehicle exhaust emissions, wheel alignment or engine operation.

In recent years, government authorities and agencies have promulgated an increasing number of regulations for which automotive vehicles must be in compliance. For example, a number of states require that automotive vehicles pass certain exhaust emissions tests in order to be certified for operation on public roads. An automotive vehicle owner whose automotive vehicle does not meet the regulations may lose his or her right to operate the vehicle and may also be required to pay substantial fines.

Automotive vehicle owners faced with the possibility of large fines or loss of license to operate the automotive vehicle on public roads may experience great temptation to tamper with the automotive vehicle testing system. At the same time, it is necessary to provide a means to access the internal components of the automotive vehicle test system. For example, in automotive vehicle test systems which print out certificates that indicate an automotive vehicle has passed a state regulatory test, it is necessary for a test equipment operator to have access to the printed certificates. However, if the operator has access to the certificates, the opportunity for test results to be altered is increased.

SUMMARY OF THE INVENTION

The present invention provides an automotive vehicle test system which includes a security system to prevent unauthorized access to automotive vehicle test results.

In the present invention, automotive vehicle test circuitry tests parameters of automotive vehicles. The present invention includes a security system which limits access to the automotive vehicle test circuitry. The present invention monitors the condition of access panels used to gain access to the automotive vehicle test equipment and activates an alarm if an improper access is attempted. Furthermore, the present invention provides limited access to those portions of the automotive vehicle test equipment to which entry is required during operation. The present invention monitors the condition of the access panels even if the automotive vehicle testing equipment has been disconnected from a power source.

Automotive vehicle test systems, particularly those which are used to provide state certification to automotive vehicles, require some type of security system to restrict access to the test equipment. In the present invention, sensors are used to monitor the conditions of access panels used to the automotive vehicle test equipment. During normal operation of the automotive vehicle test equipment, this status information is collected by a controller which activates an alarm if an access panel is improperly opened. Access panels such as, for example, a printer cover, a certificate access door, a magnetic disk drive storage system door and a back access panel may be monitored using microswitches. The microswitches indicate the condition of each door.

Furthermore, if the automotive vehicle test system is disconnected from electrical power, the security system continues to monitor the status of the microswitches. For example, power may be lost if the test equipment is unplugged from a wall outlet or due to an electrical power failure. In the present invention, a large capacitor is used as an electrical power source if power is lost from a primary power supply. The power storage capacitor is used to supply power to a latching circuit which monitors the condition of the microswitches. Should one of the microswitches be opened (which indicates that an access door has been opened), one bit in the latching circuit will be set. This bit is latched and, when power is returned to the test equipment, the microprocessor reads a status byte of the latching circuit. When power is returned to the automotive vehicle test system, if the test circuitry detects that an access door has been opened while the power was off, the test circuit can notify the operator that the test system may have been tampered with by an unauthorized person. The monitoring circuitry has a high reliability because the power storage capability of the power storage capacitor will not decrease over time or the number of charge/discharge cycles, as is the case for a storage battery.

The present invention also provides a means for an operator to gain access to a certificate printer. Following the completion of a test of an automotive vehicle, a controller activates a solenoid so that a printer certificate access door may be opened. During this period, the printer certificate access door may be opened and the certificate removed from the printer. If this access door is not closed within a predetermined time period, the controller activates an alarm.

DETAILED DESCRIPTION OF THE PREFERRED EMBODIMENTS

The present invention provides an anti-tamper device in an automotive vehicle test system which increases security of the test system.

Figure 1:
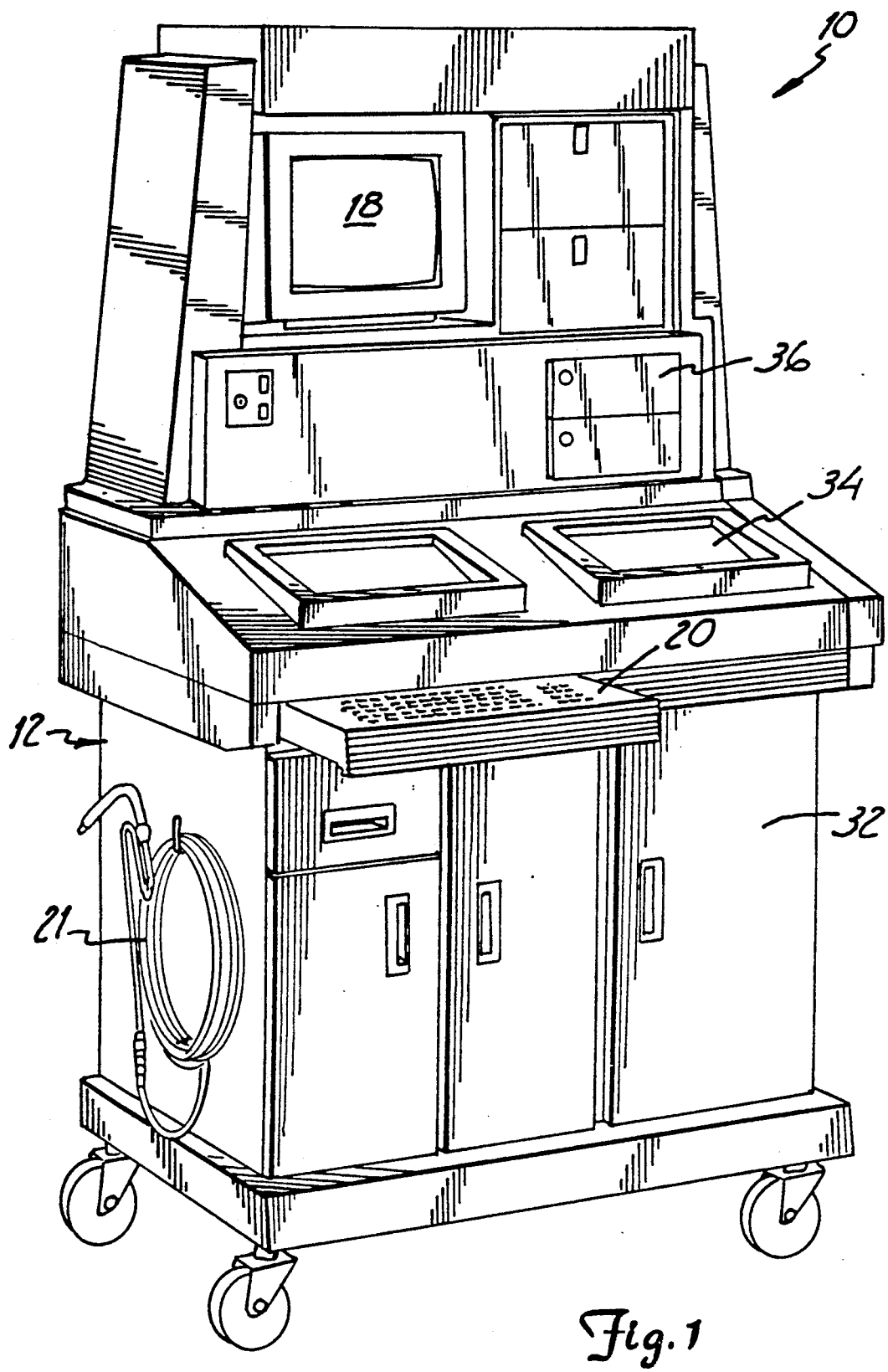
FIG. 1 is a perspective view of an automotive vehicle test apparatus.

FIG. 1 is a perspective view of an automotive vehicle test system 10. Test system 10 includes an enclosure 12 which carries a controller 14 and a test circuit 16 (shown in FIG. 2). Automotive test system 10 includes a display device 18 and a keyboard 20. A sensor 21 is carried along the side of automotive vehicle test system 10. Sensor 21 comprises, for example, an exhaust sensor. Enclosure 12 includes a certificate access panel 32, a printer cover access panel 34, and a storage device access panel 36.

Figure 2:
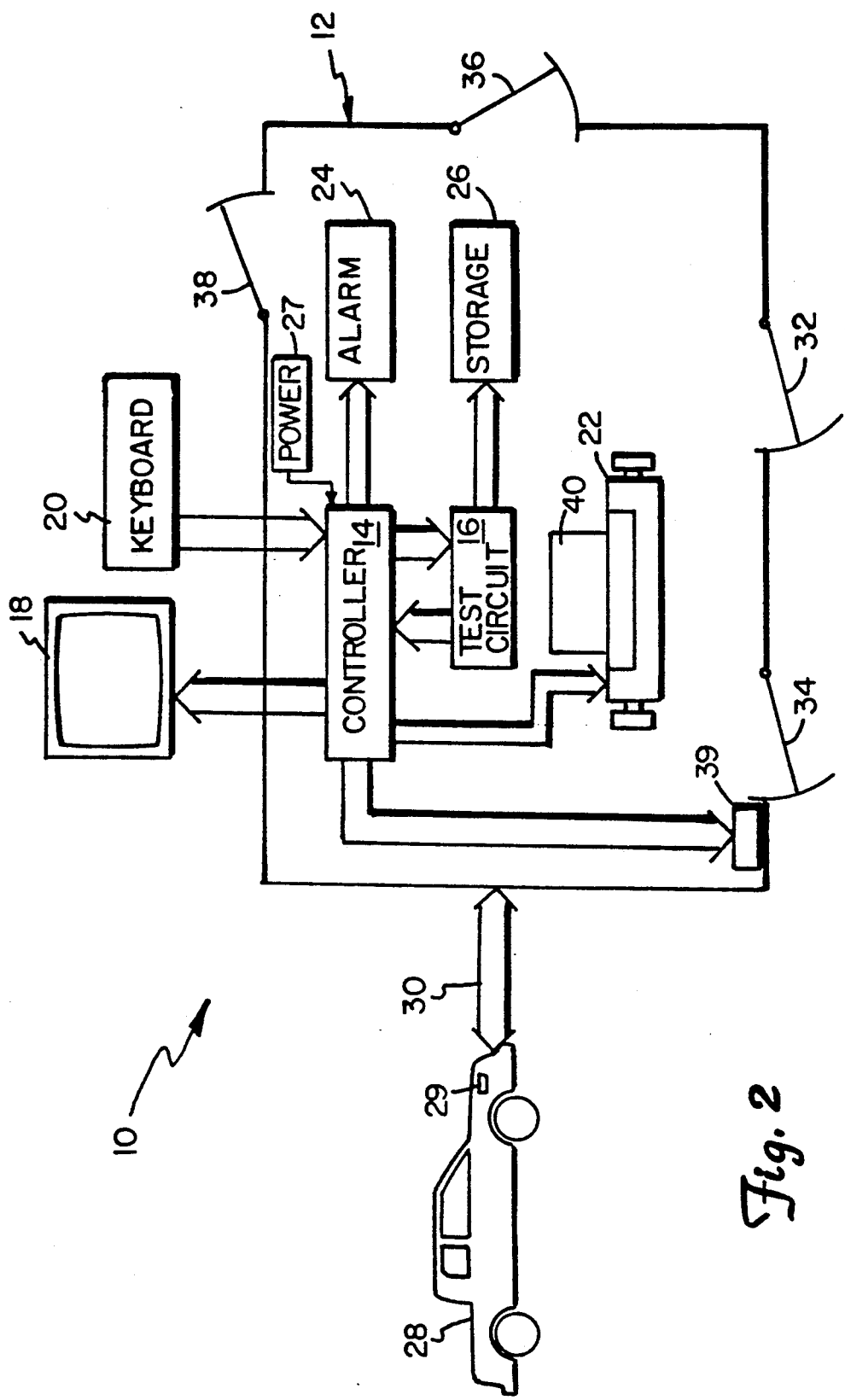
FIG. 2 is a block diagram of an automotive vehicle test apparatus in accordance with the present invention.

FIG. 2 shows automotive vehicle test equipment 10 made in accordance with the present invention. Automotive vehicle test equipment 10 includes enclosure 12 which contains controller 14 and test circuit 16. Controller 14 is connected to display device 18 and keyboard 20. Controller 14 is also connected to a printer 22 and an alarm 24. Test circuit 16 connects to a storage device 26. Storage device 26 comprises, for example, a magnetic disk storage system.

Automotive vehicle test system 10 couples to an automotive vehicle 28 through a data bus 30. Automotive vehicle test system 20 couples to sensors 29 which are connected to automotive vehicle 28. Sensors 29 may be built into automotive vehicle 28 during its manufacture, or may be coupled to vehicle 28 by a system operator.

Enclosure 12 encloses controller 14, test circuit 16, printer 22, alarm 24, storage device 26 and power supply 27. Enclosure 12 is a security device which prevents unwanted tampering with the internal components of automotive vehicle test system 10 and also protects the components from exposure to harsh environmental conditions. Enclosure 12 includes a certificate access panel 32, printer cover access panel 34, storage device access panel 36 and rear access panel 38. Printer cover access panel 34 provides access to printer 22 so that an operator can remove a certificate 40 from printer 22. Certificate access panel 32 allows an operator access to printer 22 so that, for example, the operator can load printer 22 with certificates 40 or correct a certificate 40 which becomes jammed in printer 22. Storage device access panel 36 allows an operator to have access to storage device 26. Rear access panel 38 provides operator access to internal components of automotive vehicle test system 10. A solenoid lock 39 is coupled to controller 14 and printer cover access panel 34. Solenoid lock 39 is used to selectively lock printer cover access panel 34. Solenoid lock 39 may comprise, for example, a solenoid coupled to a deadbolt-type lock.

In operation, automotive vehicle test system 10 performs tests such as, for example, exhaust analysis on automotive vehicle 28. Power is supplied to controller 14 by power supply 27. Communication link 30 transfers information between test circuit 12 and sensors 29 which connect to automotive vehicle 28. Sensors 29 may be independent from automotive vehicle 28 and connected to vehicle 28 by an operator, or sensors 29 may be a part of automotive vehicle 28 so that test circuit 16 merely plugs into a communication system of vehicle 28. The operator controls test circuit 16 through keyboard 20. The operator identifies, for example, the model, year and owner of automotive vehicle 28 to controller 14 through keyboard 20. Controller 14 displays instructions and test results on display device 18. Certificates 40 which indicate automotive vehicle 28 has passed certain performance tests may be printed by printer 22. Test results are also stored in storage system 26. Storage system 26 typically comprises a magnetic disk storage system. Controller 14 activates alarm 24 if controller 14 detects that automotive test system 10 has been improperly tampered with. For example, if an access panel 32, 34, 36 or 38 is improperly opened, controller 14 activates alarm 24. Each access panel 32, 34, 36 and 38 has a microswitch 48, 50, 52 and 54, respectively (shown in FIG. 3) which detects whether the access panel is open or closed.

Figure 3:
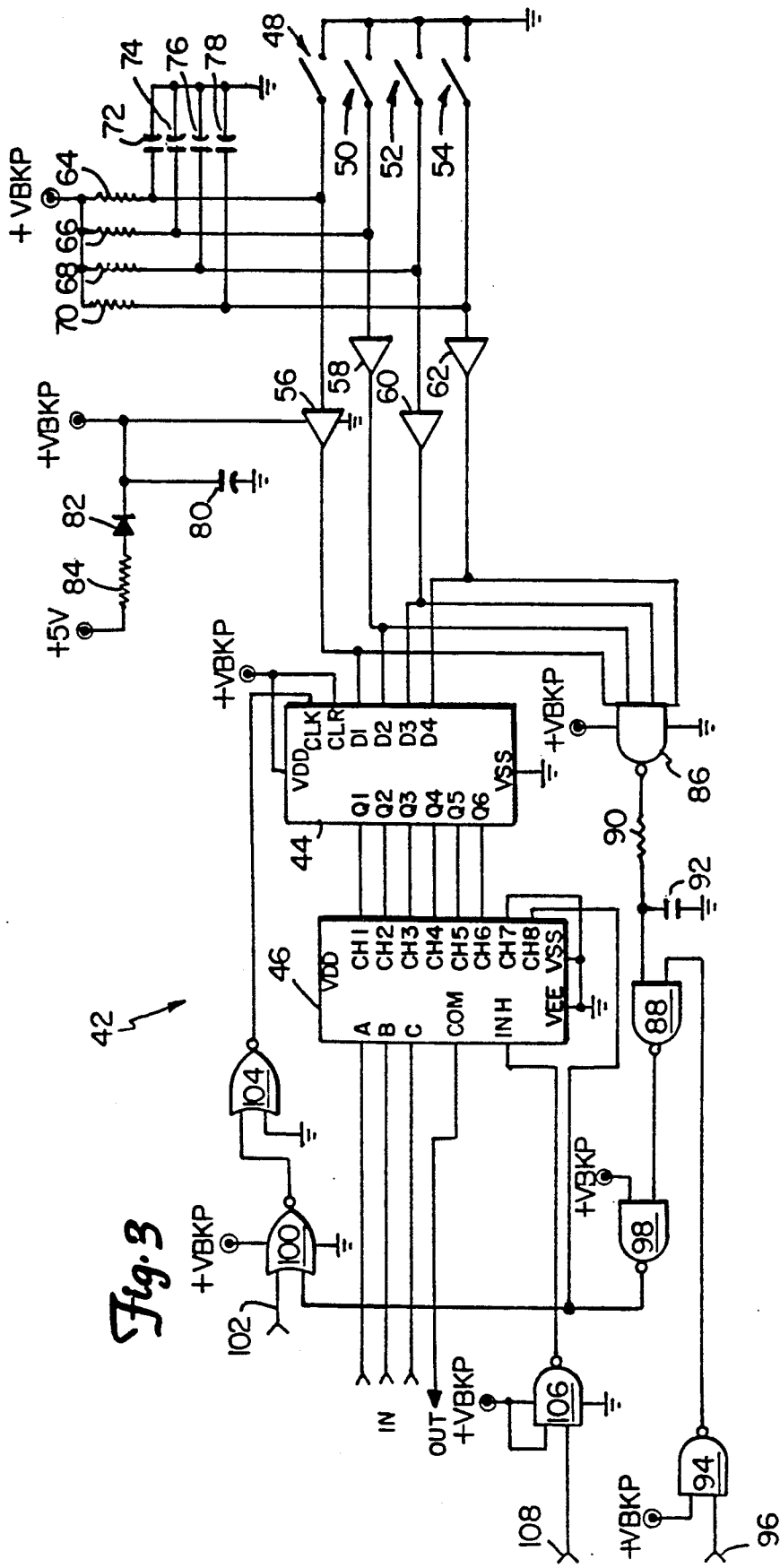
FIG. 3 is an electrical schematic diagram of circuitry in accordance with the present invention.

FIG. 3 is a schematic diagram of anti-tamper circuitry 42 in accordance with the present invention. Anti-tamper circuitry 42 includes a latch 44 and a decoder 46. Typically, anti-tamper circuitry 42 is a part of controller 14.

Microswitches 48, 50, 52 and 54 connect to latch 44 through buffers 56, 58, 60 and 62. Microswitches 48, 50, 52 and 54 sense the position of access panels 32, 34, 36 and 38, respectively. Microswitches 48, 50, 52 and 54 are normally open when access panels 32, 34, 36 and 38 are closed. If an access panel 32, 34, 36 or 38 is opened, the corresponding microswitch 48, 50, 52 or 54 connects its buffer amplifier 56, 58, 60 or 62 to an electrical ground. Buffer amplifiers 56, 58, 60 and 62 are also connected to pull-up resistors 64, 66, 68 and 70, respectively. Each pull-up resistor 64, 66, 68 and 70 is connected to a back-up power supply source, +VBKP. The input of buffer amplifiers 56, 58, 60 and 62 are also connected to an electrical ground through capacitors 72, 74, 76 and 78. Buffer amplifiers 56, 58, 60 and 62 are powered through a connection to the +VBKP power source. The +VBKP power source is connected to a large capacitor 80 and to a +5 volt power supply through a diode 82 and a resistor 84.

The outputs of buffer amplifiers 56, 58, 60 and 62 connect to inputs D1, D2, D3 and D4 of latch 44. Latch 44 is powered by the +VBKP power supply source. Latch 44 is also connected to electrical ground at the VSS connection. The outputs of buffer amplifiers 56, 58, 60 and 62 also connect to a NAND gate 86. NAND gate 86 is powered by the +VBKP power supply source and is also connected to electrical ground. The output of NAND gate 86 connects to a NAND gate 88 through a resistor 90. The output of NAND gate 86 also connects to an electrical ground through a capacitor 92. A second input of NAND gate 88 connects to a NAND gate 94. One input of NAND gate 94 connects to the +VBKP power supply. NAND gate 94 also receives an input 96. Input 96 is an external switch clock disable input. External switch clock disable input 96 is used to disable clocking of latch 44.

The output of NAND gate 88 connects to a NAND gate 98. The other input to NAND gate 98 is connected to the +VBKP power supply source. The output of NAND gate 98 connects to an NOR gate 100. NOR gate 100 is powered by the +VBKP power supply source and is also connected to electrical ground. A second input to NOR gate 100 is latch read input 102. Latch read input 102 controls the reading of latch 44. The output of NOR gate 100 is connected to NOR gate 104. The other input to NOR gate 104 is connected to electrical ground. The output of NOR gate 104 connects to a clock (CLK) input to latch 44. The CLK input to latch 44 is used to clock data through latch 44.

Outputs Q1, Q2, Q3, Q4, Q5 and Q6 of latch 44 connect to one-of-eight decoder 46. Inputs CH1, CH2, CH3, CH4, CH5 and CH6 of decoder 46 receive input from latch 44. Inputs CH7 and CH8 of decoder 46 are connected to an electrical ground. Decoder 46 is powered by the +VBKP power supply source and is also connected to electrical ground. Decoder 46 utilizes inputs A, B, and C which use a binary representation to select which channel input is brought to the COM line output. Decoder 46 also receives an inhibit input INH from a NAND gate 106. NAND gate 106 is powered by the VBKP power supply and is also connected to an electrical ground. One input to NAND gate 106 is connected to the +VBKP power supply source. A second input to NAND gate 106 comprises a power down indicator input 108. Power down indicator input 108 indicates loss of power to automotive vehicle test system 10 and is used to set the inhibit input INH to decoder 46 so that the inputs CH1–CH8 to decoder 46 enter a high impedance state.

Typically, buffer amplifiers 56, 58, 60 and 62 are carried on the same chip. NAND gates 86, 88, 94, 98 and 106 may also carried on the same chip. NOR gates 100 and 104 may be carried on a single chip. Pull-up resistors 64, 66, 68 and 70 comprise 10 Mohm resistors Capacitors 72, 74, 76 and 78 comprise 0.1 microfarad, 50 volt capacitors. Large capacitor 80 comprises a 1 farad capacitor. A 1N 5711 diode is a suitable diode for diode 82. Resistor 84 comprises a 100 ohm resistor. Resistor 90 comprises a 1 mohm resistor. Capacitor 92 is a 0.01 microfarad, 16 volt capacitor.

Buffer amplifiers 56, 58, 60 and 62 comprise a 4050A non-inverting amplifier. NAND gates 86, 88, 94, 98 and 106 are a part of a 4093A NAND gate. NOR gates 100 and 104 comprise a 4001A NOR gate. Latch 44 comprises a MC 14174 latch. Decoder 46 is a 4051 decoder.

The +5 volt power supply shown in FIG. 3 is from a power supply source which is used to supply power to the entire automotive vehicle test system 10. The +VBKP power source is a back-up power source is used when power is lost to the +5 volt power supply and is powered through large capacitor 80. Capacitor 80 is a 1 farad capacitor that can power anti-tamper circuitry 42 for several days. Diode 82 prevents large capacitor 80 from losing its charge through the path of diode 82, resistor 84 which leads to the +5 volt power supply source.

During normal operation, power supply to anti-tamper circuitry 42 is through the +5 volt power supply connected to resistor 84 and diode 82 to the +VBKP power source. In this mode, the power down indicator input 108 to NAND gate 106 is at a logic HIGH level so that decoder 46 is enabled. Each closure of microswitches 48, 50, 52 and 54 cause a CLK input to latch 44 through NAND gates 86, 88, 98 and NOR gates 100 and 104. In this condition, each switch closure of microswitches 48, 50, 52 and 54 cause a CLK input to latch 44. Furthermore, each switch closure of microswitches 48, 50, 52 and 54 is received on inputs D1, D2, D3 and D4 of latch 44. In this condition, closure of microswitches 48, 50, 52 and 54 are latched directly through to decoder 46 which provides a HIGH output to the COM output.

Upon loss of power, power is supplied to anti-tamper circuitry 42 by the +VBKP power source which is powered by large capacitor 80. Diode 82 is reverse biased to prevent discharge of large capacitor 80. Upon loss of power, power down indicator input 108 of NAND gate 106 goes low which inhibits the operation of decoder 46 so that the inputs CH1, CH2, CH3, CH4, CH5, CH6, CH7 and CH8 are in a HIGH impedance state. In this condition, each switch closure of switches 40, 50, 52 and 54 is latched by data latch 44. Input 96 to NAND gate 94 enables the clocking of latch 44 by external microswitches 48, 50, 52 and 54. In this condition, any switch closures are latched by data latch 44 until data latch 44 is cleared or power to the +VBKP power source is lost. When power is returned to automotive vehicle test system 10, the content of data latch 44 is read by decoder 46. Inputs A, B, and C are used to select which microswitch 48, 50, 52, and 54 is brought to the COM output. If controller 14 detects that a microswitch 48, 50, 52 or 54 has been closed by sensing the output of decoder 46, an alarm is activated by controller 14.

Thus, anti-tamper circuitry 42 operates in two modes. In one mode, power is supplied through the +5 volt power supply source and switch closures of microswitches 48, 50, 52 and 54 are passed directly through to the COM output of decoder 46. In a second mode, power is supplied by +VBKP power source and data is held in data latch 44 until power is returned to automotive vehicle test system 10.

Capacitor 80 is recharged when power is returned to the +5 volt power supply source. Capacitor 80 can be charged and discharged many times without damage. Furthermore, the storage capacity of capacitor 80 will not significantly decrease over time as would a storage battery.

Automotive vehicle test system 10 includes solenoid 39 which controls access to certificate 40 through certificate access panel 32. Solenoid 39 is used to lock certificate access panel 32 so that it cannot be opened. Solenoid 39 is operated by controller 14. Controller 14 allows certificate access panel 32 to be opened only following the completion of a test, after certificate 40 has been printed by printer 22. This provides limited access to certificates 40 and further limits the opportunity for certificates 40 to be altered. Following the removal of a certificate 40 from printer 22, the operator closes certificate access panel 32 and solenoid 39 is reactivated by controller 14 so that certificate access panel 32 is again locked.

The present invention provides an anti-tamper system for an automotive test system. The invention is useful in automotive vehicle test systems in which security of the testing apparatus is of importance. The testing circuitry is enclosed in a locked enclosure. Access panels provide access to portions of the test circuitry. Typically, all access panels include a standard key-actuated lock for added security. Anti-tamper circuitry monitors the condition of the access panels and activates an alarm if an access panel is opened.

The anti-tamper circuitry cannot be defeated by merely unplugging the automotive vehicle test system. A back-up power supply is used to maintain power to the anti-tamper circuitry so that the condition of the access panels is monitored. If an access panel is opened when power is lost from the automotive vehicle test system, a controller activates an alarm when the power is returned to the automotive vehicle system. A large capacitor is used to store energy to power the anti-tamper circuitry when power has been lost from automotive vehicle test system. A capacitor may be discharged many times without limiting its charge capabilities. Furthermore, a capacitor tends to have a longer lifespan than a storage battery. Access to the test circuitry is also limited by a solenoid lock. The solenoid lock allows access to printed certificates only following the completion of testing of an automotive vehicle. Following the tests, an operator can open an access panel to remove a printed certificate. During other times, the solenoid locks the certificate access panel so that it may not be opened.

Although the present invention has been described with reference to preferred embodiments, workers skilled in the art will recognize that changes may be made in form and detail without departing from the spirit and scope of the invention. For example, various levels of security codes may be used to provide a series of progressively greater access privileges to an operator. Furthermore, any number or type of access panel may be employed.

What is claimed is:

1. An automotive vehicle test system comprising:
   automotive vehicle test means for testing a function of an automotive vehicle;
   an enclosure for enclosing the automotive vehicle test means;

an access panel coupled to the enclosure for accessing the automotive vehicle test means through the enclosure;

monitor means coupled to the access panel for monitoring a condition of the access panel and providing an access panel open signal output;

latching means coupled to the monitor means for latching the access panel open signal output;

a backup power source coupled to the means for latching for providing power to the means for latching upon loss of power from a main power source;

inhibit means for providing an inhibit signal upon loss of power from the main power source;

digital means coupled to the latching means for receiving a signal from the latching means and for providing a binary output signal, wherein the digital means includes an inhibit input for receiving the inhibit signal and causing inputs to the digital means to enter a high impedance state in response to the inhibit signal;

alarm means for providing an alarm signal; and controller means coupled to the latching means and the alarm means for activating the alarm means in response to an access panel open signal output from the latching means.

2. The automotive vehicle test system of claim 1 wherein the backup power source comprises a capacitor and a diode electrically connected between the capacitor and the main power source, wherein the diode prevents the capacitor from losing a charge through the main power source upon loss of power from the main power source.

3. The automotive vehicle test system of claim 2 wherein the backup power source includes means for charging the capacitor.

4. The automotive vehicle test system of claim 1 and further including means connected to the means for latching for clocking the means for latching.

5. The automotive vehicle test system of claim 1 and further including means coupled to the access panel for selectively locking the access panel.

6. The automotive vehicle test system of claim 5 including means coupled to the means for selectively locking the access panel and to the automotive vehicle test means and the controller means, for selectively unlocking the access panel following a completion of an automotive vehicle test by the automotive vehicle test means wherein an operator may access the automotive vehicle test means through the access panel of the enclosure.

7. The automotive vehicle test system of claim 1 including a certificate printer connected to the automotive vehicle test means for printing a certificate representative of a result of an automotive vehicle test, wherein the printer is housed within the enclosure.

8. The automotive vehicle test system of claim 1 wherein the monitor means comprises a switch.

9. An automotive vehicle test system comprising:
vehicle test means for testing a function of an automotive vehicle;
a certificate printer coupled to the vehicle test means for printing a certificate representative of a result of a test of a function of the automotive vehicle;
enclosure means for enclosing the certificate printer;
an access panel coupled to the enclosure means for allowing an operator access to the certificate printer;
lock means connected to the enclosure means for selectively locking the access panel in response to a lock signal; and
controller means coupled to the vehicle test means and the lock means for providing the lock signal to the lock means except following completion of printing of a certificate wherein an operator may remove a printed certificate.

10. The apparatus of claim 9 wherein the lock means comprises a solenoid lock.

11. The apparatus of claim 9 including:
monitor means coupled to the controller means and the access panel, for monitoring a condition of the access panel and providing an access panel open signal output when the access panel is open;
alarm means connected to the controller means for providing an alarm signal; and
wherein the controller means activates the alarm means in response to an access panel open signal output from the monitor means.

12. The automotive vehicle test system of claim 11 including means coupled to the monitor means for latching the access panel open signal output.

13. The automotive vehicle test system of claim 12 and further including means connected to the means for latching for clocking the means for latching.

14. The automotive vehicle test system of claim 12 including a backup power source coupled to the means for latching for providing power to the means for latching upon loss of power from a main power source.

15. The automotive vehicle test system of claim 14 wherein the backup power source comprises a capacitor.

16. The automotive vehicle test system of claim 15 wherein the backup power source includes means for charging the capacitor.

17. The automotive vehicle test system of claim 11 wherein the monitor means comprises a switch.

18. The automotive vehicle test system of claim 9 and further including means coupled to the access panel for locking the access panel.

19. A method for providing limited access to certificates in an automotive vehicle test system comprising:
testing a function of an automotive vehicle;
printing a certificate following completion of a test of a function of the automotive vehicle; and
unlocking an access panel following completion of printing of the certificate for a limited time period to allow an operator access to the certificate.

20. A security system in an automotive vehicle test apparatus comprising:
vehicle test means for testing a function of an automotive vehicle;
a certificate printer coupled to the vehicle test means for printing a certificate representative of a result of a test of a function of the automotive vehicle;
enclosure means for enclosing the certificate printer;
an access panel coupled to the enclosure means for allowing an operator access to the certificate printer;
lock means connected to the enclosure means and the access panel for selectively locking the access panel in response to a lock signal;
monitor means coupled to the access panel for monitoring a condition of the access panel and providing an access panel open signal output;
alarm means for providing an alarm signal; and controller means coupled to the vehicle test means, the lock means, the monitor means, and the alarm means, for providing the lock signal to the lock means except following completion of printing of a certificate wherein an operator may remove a printed certificate, and for activating the alarm means in response to an access panel open signal output from the monitor means.

* * * * *